United States Patent
Li

(10) Patent No.: US 9,196,569 B2
(45) Date of Patent: Nov. 24, 2015

(54) BONDING PAD OF ARRAY SUBSTRATE, METHOD FOR PRODUCING THE SAME, ARRAY SUBSTRATE, AND LIQUID CRYSTAL DISPLAY APPARATUS

(71) Applicants: Boe Technology Group Co., Ltd., Beijing (CN); Chengdu Boe Optoelectronics Technology Co., Ltd., Chengdu, Sichuan Province (CN)

(72) Inventor: Qingshuo Li, Beijing (CN)

(73) Assignee: Boe Technology Group CO., Ltd, Beijing (CN)

( * ) Notice: Subject to any disclaimer, the term of this patent is extended or adjusted under 35 U.S.C. 154(b) by 23 days.

(21) Appl. No.: 14/081,674

(22) Filed: Nov. 15, 2013

(65) Prior Publication Data
US 2014/0168592 A1   Jun. 19, 2014

(30) Foreign Application Priority Data
Dec. 13, 2012 (CN) .......................... 2012 1 0540039

(51) Int. Cl.
*H01L 23/48* (2006.01)
*G02F 1/1345* (2006.01)
*H01L 23/00* (2006.01)

(52) U.S. Cl.
CPC .......... *H01L 23/481* (2013.01); *G02F 1/13452* (2013.01); *H01L 24/00* (2013.01); *H01L 2924/0002* (2013.01); *H01L 2924/15788* (2013.01)

(58) Field of Classification Search
CPC ............ G02F 1/1343; H01L 21/76816; H01L 23/481
USPC ................ 349/138, 42, 43; 257/390; 438/637
See application file for complete search history.

(56) References Cited

U.S. PATENT DOCUMENTS

| | | | | |
|---|---|---|---|---|
| 6,600,546 | B1* | 7/2003 | Ahn et al. | 349/187 |
| 2001/0015709 | A1* | 8/2001 | Imajo | G02F 1/13452 345/87 |
| 2003/0059976 | A1* | 3/2003 | Nathan et al. | 438/106 |
| 2004/0241987 | A1* | 12/2004 | Kim et al. | 438/672 |
| 2007/0097303 | A1* | 5/2007 | Sonoda et al. | 349/122 |
| 2008/0128826 | A1* | 6/2008 | Fukamizu et al. | 257/379 |
| 2009/0115950 | A1* | 5/2009 | Toyota | G02F 1/136213 349/114 |
| 2012/0182490 | A1* | 7/2012 | Kim et al. | 349/43 |
| 2012/0307173 | A1* | 12/2012 | Fujita | G02F 1/136227 349/43 |

* cited by examiner

*Primary Examiner* — Sang V Nguyen
(74) *Attorney, Agent, or Firm* — Kinney & Lange, P.A.

(57) ABSTRACT

A bonding pad of an array substrate, comprising: a gate electrode formed on the array substrate; a first insulation layer formed on the gate electrode; a first conductive layer formed on the first insulation layer; a Source/Drain electrode (S/D) layer formed on the first conductive layer; a second insulation layer formed on the S/D layer; and a second conductive layer formed on the second insulation layer, wherein the second insulation layer is formed with a bonding pad via through which the second conductive layer is electrically connected to the first conductive layer, and the second conductive layer is separated from the S/D layer by the second insulation layer and does not contact the S/D layer. The present invention also discloses a method for producing the bonding pad, an array substrate comprising the bonding pad, and a liquid crystal display apparatus comprising the array substrate.

5 Claims, 3 Drawing Sheets

BONDING PAD OF ARRAY SUBSTRATE, METHOD FOR PRODUCING THE SAME, ARRAY SUBSTRATE, AND LIQUID CRYSTAL DISPLAY APPARATUS

CROSS-REFERENCE TO RELATED APPLICATION

This application claims the benefit of Chinese Patent Application No. 201210540039.3 filed on Dec. 13, 2012 in the State Intellectual Property Office of China, the whole disclosure of which is incorporated herein by reference.

BACKGROUND OF THE INVENTION

1. Field of the Invention

The present invention relates to a manufacturing technology of a liquid crystal display (LCD), more particularly, relates to a bonding pad of an array substrate, a method for producing the same, an array substrate, and a liquid crystal display apparatus.

2. Description of the Related Art

When LCD products are used in various applications, for example, a warm humid condition, a simulation environment experiment, a module assembly, a terminal client user, etc., an unit cell of the LCD product may occur a metallic corrosion in a bonding pad via, causing a line display defect, an abnormal display defect, etc.

By analyzing the metallic corrosion failure in the bonding pad via, the reasons are conducted as follows:

As shown in FIGS. 1-2, a second Indium Tin Oxide (ITO) layer 4 is not densely formed on a surface of a Source/Drain electrode (S/D) layer 2, or a metal surface of the S/D layer 2 exposed by dry etching a via in a passivation layer (for example passivation SiNX (PVX)) 3 is not flat. As a result, voids or gaps occur between the second Indium Tin Oxide (ITO) layer 4 and the surface of the S/D layer 2. Since the voids or gaps have a size much larger than a diameter of a water molecule, water moisture can enter into the voids or gaps and contact with a metal material on the S/D layer 2, such as, Mo, Al or AlNd, to form a primary battery. Thereby, an electrochemical reaction takes place and causes the metal material to corrode and the LCD product to fail.

SUMMARY OF THE INVENTION

The present invention has been made to overcome or alleviate at least one aspect of the above mentioned disadvantages.

Accordingly, it is an object of the present invention to provide a bonding pad of an array substrate, a method for producing the same, an array substrate, and a liquid crystal display apparatus that can avoid a metal corrosion in a bonding pad via, improve product quality and stability.

According to an aspect of the present invention, there is provided a bonding pad of an array substrate, comprising: a gate electrode formed on the array substrate; a first insulation layer formed on the gate electrode; a first conductive layer formed on the first insulation layer; a Source/Drain electrode (S/D) layer formed on the first conductive layer; a second insulation layer formed on the S/D layer; and a second conductive layer formed on the second insulation layer, wherein the second insulation layer is formed with a bonding pad via through which the second conductive layer is electrically connected to the first conductive layer, wherein the second conductive layer is separated from the S/D layer by the second insulation layer and does not contact the S/D layer.

In the above bonding pad, the first conductive layer and the second conductive layer are made of Indium Tin Oxide (ITO).

In the above bonding pad, the first insulation layer and the second insulation layer are made of Passivation SiNx (PVX).

In the above bonding pad, the S/D layer is transversely cut off by the bonding pad via at a position of the S/D layer in a longitudinal direction of the S/D layer.

In the above bonding pad, the bonding pad via is located at an upper longitudinal side or a lower longitudinal side of the S/D layer.

In the above bonding pad, the bonding pad via is located in a window etched in the S/D layer.

In the above bonding pad, the bonding pad vias are located at an upper longitudinal side and a lower longitudinal side of the S/D layer, respectively.

In the above bonding pad, the bonding pads comprise a bonding pad on an integrated circuit of the array substrate and a bonding pad at an edge position of a pair of combined glass substrates.

According to another aspect of the present invention, there is provided a method for producing a bonding pad of an array substrate, comprising:

S100: forming a first conductive layer on a first insulation layer;

S200: forming a Source/Drain electrode (S/D) layer on the first conductive layer and exposing the first conductive layer from the S/D layer at a bonding pad via position;

S300: forming a second insulation layer on the S/D layer and opening the second insulation layer at the bonding pad via position to form a bonding pad via; and S400: forming a second conductive layer on the second insulation layer;

wherein the second conductive layer is separated from the S/D layer by the second insulation layer and does not contact the S/D layer.

In the above method, the step S200 comprising:

forming the S/D layer (2) on the first conductive layer (5) by depositing, masking, semi-hole ashing and wet etching, and etching the S/D layer (2) within the bonding pad via (6) to expose the first conductive layer (5).

According to another aspect of the present invention, there is provided an array substrate comprising the above mentioned bonding pad.

According to another aspect of the present invention, there is provided a liquid crystal display apparatus comprising an upper substrate, a lower substrate combined with the upper substrate, and a liquid crystal filled between the upper and lower substrates, wherein the lower substrate is the above mentioned array substrate.

The present invention provides a bonding pad of an array substrate, a method for producing the same, an array substrate, and a liquid crystal display apparatus. The bonding pad comprising: a gate electrode formed on the array substrate; a first insulation layer formed on the gate electrode; a first conductive layer formed on the first insulation layer; a Source/Drain electrode (S/D) layer formed on the first conductive layer; a second insulation layer formed on the S/D layer; and a second conductive layer formed on the second insulation layer, wherein the second insulation layer is formed with a bonding pad via through which the second conductive layer is electrically connected to the first conductive layer, and the second conductive layer is separated from the S/D layer by the second insulation layer and does not contact with the S/D layer. With such configuration, it can prevent water moisture from entering through the second conductive layer and prevent the water moisture from contacting with the metal on the S/D layer to form a primary battery, avoiding a metal corrosion in the bonding pad via, improving the product quality and stability.

BRIEF DESCRIPTION OF THE DRAWINGS

The above and other features of the present invention will become more apparent by describing in detail exemplary embodiments thereof with reference to the accompanying drawings, in which.

LIST OF REFERENCE NUMERALS OF DRAWINGS

Figure 1:
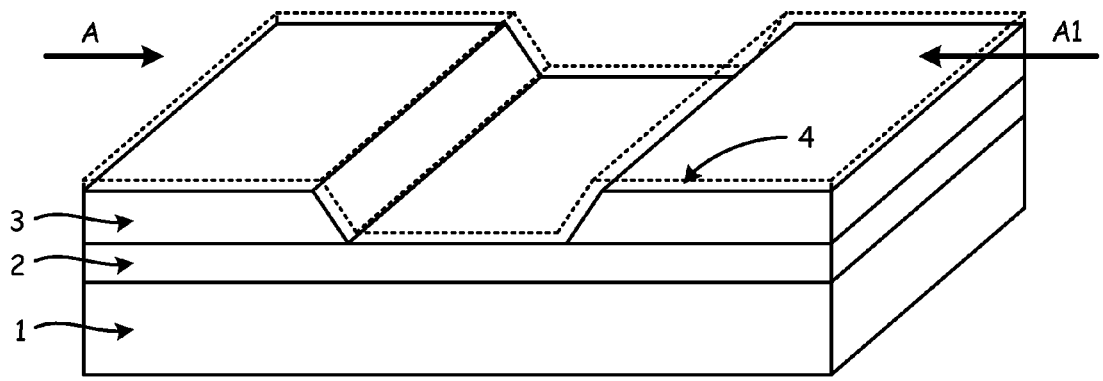
FIG. 1 is an illustrative perspective view of a structure of a bonding pad of an array substrate in a prior art.
Figure 2:
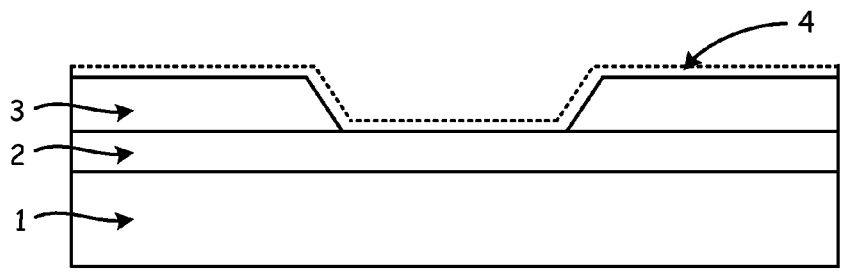
FIG. 2 is a cross section view of the bonding pad of the array substrate of FIG. 1 in a longitudinal direction A-A1.

1: first insulation layer;
2: S/D layer;
3: second insulation layer;
4: second conductive layer;
5: first conductive layer;
6: bonding pad via.

DETAILED DESCRIPTION OF PREFERRED EMBODIMENTS OF THE INVENTION

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

The general concept of the present invention is to provide a bonding pad of an array substrate, comprising: a gate electrode formed on the array substrate; a first insulation layer formed on the gate electrode; a first conductive layer formed on the first insulation layer; a Source/Drain electrode (S/D) layer formed on the first conductive layer; a second insulation layer formed on the S/D layer; and a second conductive layer formed on the second insulation layer, wherein the second insulation layer is formed with a bonding pad via through which the second conductive layer is electrically connected to the first conductive layer, and the second conductive layer is separated from the S/D layer by the second insulation layer and does not contact with the S/D layer.

Hereafter, it will describe the present invention in detail with reference to the accompanying drawings and exemplary embodiments.

Figure 3:
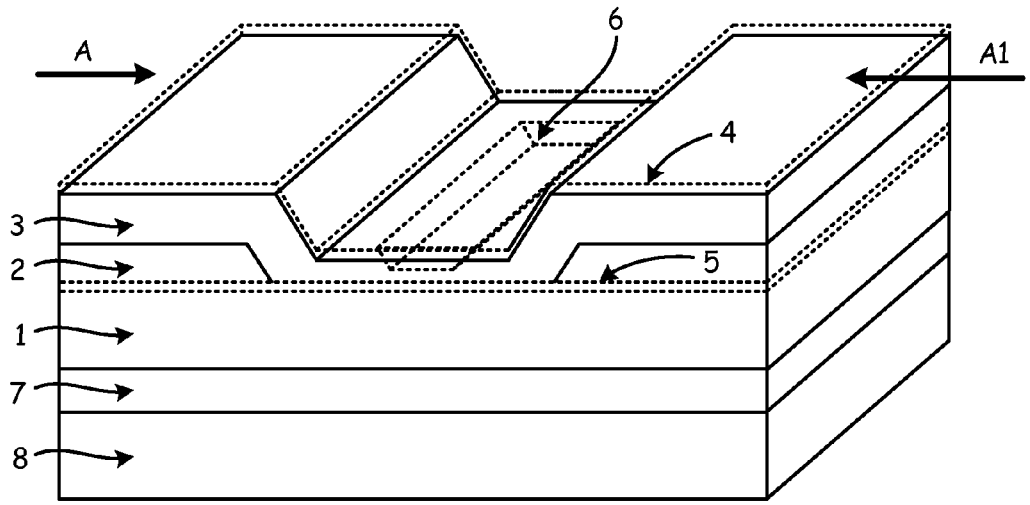
FIG. 3 is an illustrative perspective view of a structure of a bonding pad of an array substrate according to an exemplary embodiment of the present invention.
Figure 4:
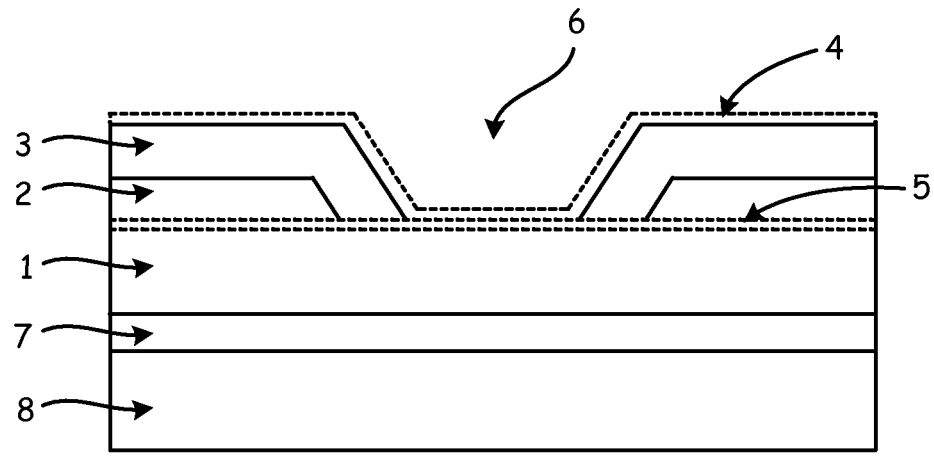
FIG. 4 is a cross section view of the bonding pad of the array substrate of FIG. 3 in a longitudinal direction A-A1.

As shown in FIGS. 3-4, a bonding pad of an array substrate comprises a gate electrode 7 formed on a substrate 8, a first insulation layer 1, a first conductive layer 5, a Source/Drain electrode (S/D) layer 2, a second insulation layer 3, and a second conductive layer 4. The first conductive layer 5 is formed on the first insulation layer 1. The S/D layer 2 is formed on the first conductive layer 5. The second insulation layer 3 is formed on the S/D layer 2. The second conductive layer 4 is formed on the second insulation layer 3. The second insulation layer 3 is formed with a bonding pad via 6 through which the second conductive layer 4 is electrically connected to the first conductive layer 5. Furthermore, the second conductive layer 4 is separated from the S/D layer 2 by the second insulation layer 3 and does not contact with the S/D layer 2.

In an exemplary embodiment of the present invention, the first conductive layer 5 and the second conductive layer 4 may be made of Indium Tin Oxide (ITO).

In an exemplary embodiment of the present invention, the first insulation layer 1 and the second insulation layer 3 may be made of Passivation SiNx (PVX).

Figure 5:
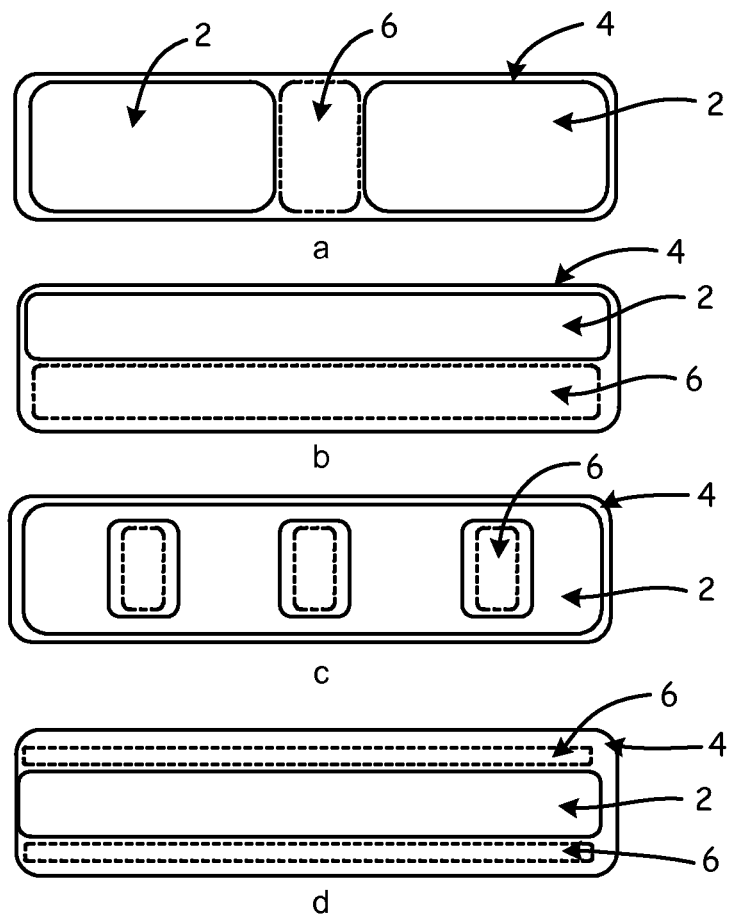
FIGS. 5a-5d are illustrative views for showing various positions where the bonding pads of the array substrate are located.

FIG. 5a is a top view of the S/D layer 2 of FIG. 3. In a first exemplary embodiment of the bonding pad via, as shown in FIGS. 3 and 5a, the S/D layer 2 is transversely cut off by the bonding pad via 6 at a position of the S/D layer 2 in a longitudinal direction A-A1 of the S/D layer 2. Herein, the S/D layer 2 may be transversely cut off by the bonding pad via 6 at any position of the S/D layer 2 in the longitudinal direction A-A1, for example, at a middle position of the S/D layer 2 in the longitudinal direction A-A1.

In a second exemplary embodiment of the bonding pad via, the bonding pad via 6 may be located at an upper longitudinal side or a lower longitudinal side of the S/D layer 2. As shown in FIG. 5b, the bonding pad via 6 is located at the lower longitudinal side of the S/D layer 2.

In a third exemplary embodiment of the bonding pad via, as shown in FIG. 5c, one or more window(s) is/are etched in the S/D layer 2, and the bonding pad via 6 is located in the respective window.

Figure 6:
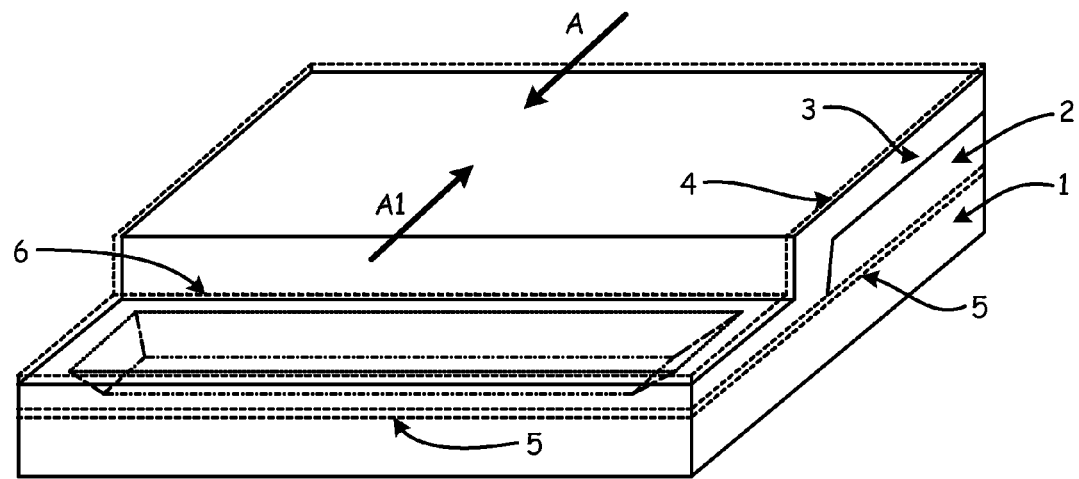
FIG. 6 is an illustrative perspective view of a bonding pad structure in which bonding pad vias are located at both upper and lower longitudinal sides of a S/D layer according to an exemplary embodiment of the present invention.
Figure 7:
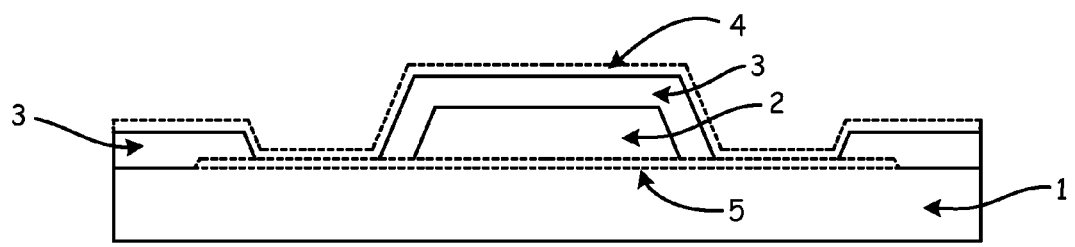
FIG. 7 is a cross section view of the bonding pad of the array substrate of FIG. 6 along a longitudinal line A-A1.

In a fourth exemplary embodiment of the bonding pad via, as shown in FIG. 5d, the bonding pad vias 6 are located at the upper longitudinal side and the lower longitudinal side of the S/D layer 2, respectively. In this case, an illustrative perspective view and a cross section view of the bonding pad are shown in FIG. 6 and FIG. 7.

The bonding pads comprise a bonding pad for an integrated circuit of the array substrate and a bonding pad located at an edge position of a pair of combined glass substrates.

In order to achieve the above mentioned bonding pad of the array substrate, the present invention also provides a method for producing a bonding pad of an array substrate, comprising steps of:

S100: forming a first conductive layer 5 on a first insulation layer 1;

S200: forming a Source/Drain electrode (S/D) layer 2 on the first conductive layer 5 and exposing the first conductive layer 5 from the S/D layer 2 at a bonding pad via position;

S300: forming a second insulation layer 3 on the S/D layer 2 and opening the second insulation layer 3 at the bonding pad via position to form a bonding pad via 6; and S400: forming a second conductive layer 4 on the second insulation layer 3;

wherein the second conductive layer 4 is separated from the S/D layer 2 by the second insulation layer 3 and does not contact with the S/D layer 2.

The above mentioned step S200 comprises steps of:

forming the S/D layer 2 on the first conductive layer 5 by depositing, masking, semi-hole ashing and wet etching, and etching the S/D layer 2 within the bonding pad via 6 to expose the first conductive layer 5.

According to the first exemplary embodiment of the bonding pad via, as shown in FIG. 5*a*, the bonding pad via 6 is located at a middle position of the S/D layer 2 in the longitudinal direction and transversely cut off the S/D layer 2. Please be noted that the S/D layer 2 may be transversely cut off by the bonding pad via 6 at any position of the S/D layer 2 in the longitudinal direction A-A1, for example, the S/D layer 2 may be transversely cut off by the bonding pad via 6 at the middle position of the S/D layer 2 in the longitudinal direction A-A1.

According to the second exemplary embodiment of the bonding pad via, the bonding pad via 6 may be located at an upper longitudinal side or a lower longitudinal side of the S/D layer 2. As shown in FIG. 5*b*, the bonding pad via 6 is located at the lower longitudinal side of the S/D layer 2.

According to the third exemplary embodiment of the bonding pad via, as shown in FIG. 5*c*, one or more window(s) is/are etched in the S/D layer 2, and the bonding pad via 6 is located in the respective window.

According to the fourth exemplary embodiment of the bonding pad via, as shown in FIG. 5*d*, the bonding pad vias 6 are located at the upper longitudinal side and the lower longitudinal side of the S/D layer 2, respectively. In this case, an illustrative perspective view and a cross section view of the bonding pad are shown in FIG. 6 and FIG. 7.

Based on the above mentioned bonding pad of the array substrate in various embodiments, the present invention also provides an array substrate comprising the above mentioned bonding pad.

Based on the above mentioned array substrate in various embodiments, the present invention also provides a liquid crystal display apparatus comprising an upper substrate, a lower substrate combined with the upper substrate, and a liquid crystal filled between the upper and lower substrates, wherein the lower substrate is the above mentioned array substrate.

The liquid crystal display apparatus of the present invention may be used in a liquid crystal display panel, a liquid crystal TV, a liquid crystal display device, a digital photo frame, an electronic paper, a mobile telephone, and so on.

It should be appreciated for those skilled in this art that the above embodiments are intended to be illustrated, and not restrictive to the scope of the present invention.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. An array substrate, comprising:
a gate electrode formed on a substrate;
a first insulation layer formed on the gate electrode;
a first conductive layer formed on the first insulation layer;
a source electrode or drain electrode formed on the first conductive layer;
a second insulation layer formed on the source electrode or drain electrode; and
a second conductive layer formed on the second insulation layer,
wherein the second insulation layer is formed with a bonding pad via through which the second conductive layer is electrically connected to the first conductive layer,
wherein the second conductive layer is separated from the source electrode or drain electrode by the second insulation layer and does not contact with the source electrode or drain electrode, and
wherein the source electrode or drain electrode has a longitudinal direction and a lateral direction, and the source electrode or drain electrode is transversely cut off by the bonding pad via at a position of the source electrode or drain electrode in the longitudinal direction, such that the source electrode or drain electrode is divided into separate segments.

2. The array substrate according to claim 1,
wherein the first conductive layer and the second conductive layer are made of Indium Tin Oxide (ITO).

3. The array substrate according to claim 1,
wherein the first insulation layer and the second insulation layer are made of Passivation SiNx (PVX).

4. A method for producing the array substrate according to claim 1, comprising steps of:
forming the first conductive layer on the first insulation layer;
forming the source electrode or drain electrode on the first conductive layer and exposing the first conductive layer from the source electrode or drain electrode at a bonding pad via position;
forming the second insulation layer on the source electrode or drain electrode and opening the second insulation layer at the bonding pad via position to form the bonding pad via; and
forming the second conductive layer on the second insulation layer.

5. The method according to claim 4, wherein the step of forming the source and drain electrode layer on the first conductive layer and exposing the first conductive layer from the source and drain electrode layer at the bonding pad via position comprising steps of:
forming the source electrode or drain electrode on the first conductive layer by depositing, masking, semi-hole ashing and wet etching, and
etching the source electrode or drain electrode within the bonding pad via to expose the first conductive layer.

* * * * *